United States Patent [19]

Henkelmann

[11] Patent Number: 4,789,824

[45] Date of Patent: Dec. 6, 1988

[54] DIGITAL MEASURING INSTRUMENT FOR DISPLAYING A MEASURED VALUE THAT VARIES OVER TIME

[75] Inventor: Dieter Henkelmann, Mannheim, Fed. Rep. of Germany

[73] Assignee: Brown, Boveri & Cie AG, Mannheim, Fed. Rep. of Germany

[21] Appl. No.: 65,020

[22] Filed: Jun. 19, 1987

[30] Foreign Application Priority Data

Jun. 20, 1986 [DE] Fed. Rep. of Germany ....... 3620723

[51] Int. Cl.[4] .................. G01R 1/00; G01R 19/26; G01R 15/08
[52] U.S. Cl. .................. 324/114; 324/99 D; 324/115; 324/120; 364/483
[58] Field of Search .............. 324/120, 114, 99 R, 324/99 D, 115, 111; 364/483

[56] References Cited

U.S. PATENT DOCUMENTS 3,689,835  9/1972  Bickford ........................... 324/114
3,726,250  10/1973  Merk ............................ 324/115
4,258,317  3/1981  Dubauskas ......................... 324/114

FOREIGN PATENT DOCUMENTS 2939787  4/1980  Fed. Rep. of Germany .
3035167  5/1982  Fed. Rep. of Germany .
3408026  9/1985  Fed. Rep. of Germany .
3407942  9/1985  Fed. Rep. of Germany .
3412297  10/1985  Fed. Rep. of Germany .
3438511  4/1986  Fed. Rep. of Germany .

Primary Examiner—Ernest F. Karlsen
Attorney, Agent, or Firm—Herbert L. Lerner; Laurence A. Greenberg

[57] ABSTRACT

In order to display a measured value, a digital measuring instrument is provided with a digital display and an analog display. The display value emitted by the digital display is fixed during a predetermined holding time. The analog display displays the difference between the current measured value and the particular display value of the digital display at the time. The current measured value may be read off at the beginning of a new holding time on the digital display, or it can be ascertained as the sum of the values of the digital and analog displays.

20 Claims, 6 Drawing Sheets

DIGITAL MEASURING INSTRUMENT FOR DISPLAYING A MEASURED VALUE THAT VARIES OVER TIME

The invention relates to a digital measuring instrument for displaying a measured value varying over time, comprising sequence control means for ascertaining at least one instantaneous value in each of a plurality of measuring cycles by sensing a measured value and for forming a cycle value from the instantaneous values occurring per measuring cycle, said sequence control means including a memory storing the most recent cycle value until a new cycle value is present that replaces an old cycle, a digital display connected to said sequence control means for displaying a digital display value derived from the most recent cycle value in response to a control signal, said sequence control means retaining the digital display value until it forms a current digital display value from a new cycle value in response to a new control signal.

As a man/machine interface, the display of the measured value plays a decisive role in measuring instruments. It has been found that digital displays are always preferred whenever a measured value is to be read out with high accuracy. The precondition, however, is that the digital display does not undergo any change during the readout process. Measured value changes that are relatively rapid in proportion to the read-out speed can be followed much better on an analog display. Conventional analog displays have the disadvantage, however, that their sensitivity is related to the end value of the measurement range. Thus relatively small measured value changes with respect to a high end value of a measurement range are virtually impossible to see on conventional scales.

German Published, Non-Prosecuted Patent Application No. DE-OS 34 12 297 discloses a method and an apparatus for displaying digital values of a changing variable that arise at chronologically successive intervals. Through the use of that device, an improved resolution of the digital display is attained by providing that a basic value stored in memory is subtracted from the particular measured value and only the particular differential value is displayed in analog fashion. If the differential value exceeds the measurement range of the analog display, then a new basic value is automatically calculated as a function of the instantaneous measured value, in such a way that the resulting differential value is within the measurement range of the analog display.

The differential value can accordingly be conceived of as a window which is made to follow up the varying measured value with the aid of the basic value and thus enables observation of the change in the measured value. Since the window reproduces only a small segment of a measurement range, the resolution of the scale is increased considerably with the same scale length.

However, a disadvantageous of the device is that the switchover of the basic value is carried out as a function of the magnitude of the differential value. With large changes in the measured value within a short time, the differential value rapidly exceeds the window and accordingly results in a rapid change in the basic value that is to be displayed in digits. Since on one hand the analog display jumps to a new position each time there is a switchover of the basic value and on the other hand because of its rapid change the basic value can only be read out with difficulty, if at all, observation of the measured value with the aid of the analog display and digital display does not always produce a satisfactory outcome.

In a measuring instrument according to German Published, Non-Prosecuted Patent Application No. DE-OS 34 08 026, corresponding to U.S. Pat. No. 4,748,404, the above-mentioned disadvantages are avoided by providing that when there is a changeover of the window as a function of the changing measured value, the window width and thus the sensitivity of the analog display are simultaneously optimized as well in accordance with the change in the measured value. However, the analog display is constructed such that the digital values required for designating the scale must define the location of the measurement range segment. To this end, at least two controllable digital displays with a suitable number of digits are needed, which requires a relatively high cost.

It is accordingly an object of the invention to provide a digital measuring instrument for displaying a measured value that varies over time, which overcomes the hereinaforementioned disadvantages of the heretofore-known devices of this general type and which makes it possible to observe measured values having a relatively large and rapid change by means of a combined analog and digital display, wherein the digital display is to be easily readable at any time and the analog display allows an observation of the change and trend in the measured value.

With the foregoing and other objects in view, there is provided in accordance with the invention, a digital measuring instrument for displaying a measured value varying over time, comprising sequence control means for ascertaining at least one instantaneous value in each of a plurality of measuring cycles by sensing a measured value and for forming a cycle value from the instantaneous values occurring per measuring cycle, said sequence control means including a memory storing the most recent cycle value until a new cycle value is present that replaces an old cycle, a digital display connected to said sequence control means for displaying a digital display value derived from the most recent cycle value in response to a control signal, said sequence control means retaining the digital display value until it forms a current digital display value from a new cycle value in response to a new control signal, said sequence control means forming differential values between a given digital display value and the continuously occurring cycle values, an analog differential value scale connected to said sequence control means for displaying various differential values, and means connected to said sequence control means containing at least one switching element emitting a control signal after the expiration of a predetermined holding time for switching said digital display to the instantaneous current display value.

With the objects of the invention in view there is also provided a measuring instrument for displaying a measured value varying over time, comprising a display having triggerable screen segments providing a quasi-analog display, at least two scales parallel and alongside one another, each of said scales encompassing one partial range scale, and said partial range scales together encompassing a total given measurement range, and a display marker traveling from one of said partial range scales to the next one of said partial range scales.

The invention has the advantage that of permitting one to concentrate on the particular factor in a given measurement signal that is of interest, while observing the measured signal. If measurement is to be as accurate as possible, which is the simplest with the aid of the digital display, then the holding time will be selected in such a way that the digital display remains just readily readable yet nevertheless follows up the measured value as quickly as possible. The analog display in this case only provides an auxiliary function, which expresses whether the measured value is continuing to change or has attained a static state.

On the other hand, if a measurement is not required but only observation of the trend of the change and optionally observation of the order of magnitude thereof as well, then a relatively long holding time will be selected and the observer's attention will be directed primarily to the analog display. In this case, the digital display merely performs an auxiliary function, which makes it possible to estimate the order of magnitude of the change in the measured value.

It is suitable to use a plus/minus scale for the analog display and basically to relate the differential value to zero. With an increasing measured value, the differential values then increase from zero toward positive values.

It may also be suitable for an optionally automatically predetermined holding time to be interrupted manually at a suitable moment, to enable reading out of the instantaneous value on the digital display.

If the change in the measured value is to be followed over a large range on the analog display, then it is suitable for its sensitivity to be optimized either manually or automatically. The optimizing may be done in such a way that a switchover of the measurement range is not necessary, or such that the greatest possible display sensitivity at a given time is attained.

In the case of highly dynamic measured values, that is, when there are pronounced changes of the measured value per unit of time, it can be expected that the differential value will relatively quickly exceed a measurement range of high sensitivity. It is accordingly suitable to reduce the sensitivity of the measurement range automatically in this case.

In certain cases it may also be advantageous to make the holding time dependent on some other variable, such as on the measured value dynamics. In the normal case, however, the duration of the holding time will be defined such that there is good readability of the digital display, and this duration is preferably selectable in a range from 0.5 to 5 seconds. Once the holding time has been set, it can remain constant over a predetermined period of time.

It is advantageous for the digital display value on the digital display not to be derived from a single instantaneous value, but instead to form a mean value from a plurality of instantaneous values within one measurement cycle. This makes it possible to eliminate brief peaks of the measurement value, for instance resulting from interference.

In exceptional cases, it may be necessary for the analog scale to be used not only for observing the trend of a change but in fact for measurement as well. In this case, it is necessary to add the analog measured value ascertained on the analog scale to the digital display value shown on the digital display. In order to make this calculation process easier, it is advantageous for automatic rounding means to perform a rounding operation, with suitable graduation, based on the current cycle value. The rounding may relate to the lowermost graduation of the display value or to higher graduations.

From time to time it is desirable to ascertain slowly changing variables not only in an alternating current range, that is following a rectification operation, but instead to ascertain them in the direct current range in terms of their negative and positive amplitude. This is facilitated by storing at least the last maximal and/or minimal differential value shown prior to a reversal of the direction of change in a memory as an upper or lower trend-changing value and displaying it on an analog scale. The display may also be carried out in combination with the particular current differential value.

It is advantageous to use a standardized scale for the analog display, because such a scale can be designated independently of the selected measurement range of the digital display. In such a case, the scale numbering only needs to be adapted if there is a change in the sensitivity of the analog range. However, this may be done simply by adding or taking away a zero at the end value of the scale. With a standardized scale, the differential value is displayed as a percentagewise analog value with respect to the cycle value or to the measurement range end value of the digital display. If the end value of the measurement range of the digital display is used as a reference value for the numbering of the analog scale, then if the differential value stays the same and the deflection of the analog display also remains the same over the entire measurement range; this is advantageous for rapid determination of the absolute value.

Another embodiment of the invention provides that if the differential value exceeds a predetermined threshold range or one of the two ends of the scale, it triggers a threshold signal. Depending on whether the threshold signal for the measurement range indicates excessively large or excessively small signals, a switchover of the measurement range of the analog display is made automatically to a measurement range having greater or lesser sensitivity.

In order to minimize the cost, it is also advantageous to use the digital display with as much variety as possible. Thus a further embodiment of the invention provides that the digital display is switched over in response to a first switching command in such a way that is displays the instantaneous measured value. A second or third switching command permits a display of the maximal value or minimal value that has arisen in the course of a monitoring period or within a least measurement cycle on the digital display.

A digital measuring instrument that attains the object of the invention is constructed in principle like conventional digital measuring instruments. The substantial differences are that the holding time during which the digital display can be read out is selected somewhat longer in the normal instance and at the beginning of each holding time the differential value resulting between the current measured value and the displayed value on the digital display is shown on an analog scale. The difference formation and the remaining sequence is determined by sequence control means assembled from conventional logic elements, optionally using a suitably programmed microprocessor. Suitably, the particular holding time can be adjusted manually to the desired value and can optionally also be interrupted at a suitable moment. It is advantageous if the last cycle value at a given time is retained in the digital display, whenever the measuring circuit is opened or in response to a manually triggered command, until such time as some other command causes a new cycle value to be emitted.

The analog display can be constructed with the aid of an analog measuring mechanism or as a digital quasi-analog display. For the quasi-analog display, liquid crystal displays are preferred which are divided into individual screen segments in accordance with the figures and symbols to be displayed and are triggered in multiplex fashion.

The representation of the measured value on the analog display is done with the aid of a standardized plus/minus scale. This scale, preferably calculated in percent, can suitably be switched over in such a way that either the end value of the measurement range of the digital display or the particular value of the instantaneous digital display serves as a reference value. The sensitivity of the analog display can also be varied by means of a switchover, preferably of the amplification.

In more convenient measuring instruments, two digital displays will be provided, one of which shows the digital display value to be added to the differential value and the other of which shows the instantaneous measured value or some other selectable value, for instance. As a result, during very long holding times, which are suitable while observing the analog display, the instantaneous cycle value can also be read out at any time on a digital display.

However, the utility of a measuring instrument can be increased substantially by providing not only a double digital display but also a quasi-analog display having a plurality of scales. One or more display markers, in the form of pointer markers or bar displays, can be assigned to the scales. In order to facilitate the read-out, it is suitable to place a plurality of scales on the display and to make the scales themselves, or their pointer markers, invisible by means of a blanking-out switch, which is actuated by scale switchover means.

A substantial improvement can be attained if the scale switchover means makes it possible to switch over between a scale having a zero point in the center of the scale and a scale having a zero point at the beginning of the scale. If the scales having the zero at the center are constructed as standardized scales and the scales with the zero point at the beginning of the range are constructed as basic scales encompassing the entire measurement range, then the representation of the measured value becomes easier to follow. This is attained in particular by providing that when the measured value is shown on a basic scale, no differential values are formed, but instead the analog display as well as preferably the digital display each show the entire measured value. With a display of the differential value alone for increasing the display sensitivity, the reference to the total measurement range is very easily lost for the person doing the measurement, so that he may overestimate the measured value changes that are shown in enlarged form. The switchover furthermore makes it possible to observe large measured value changes on the basic scale and small measured value changes on the differential value scale.

It may be suitable to construct the measurement range switch for the two variant scales in such a way that the switchover of sensitivity is made for both with either the same or separate switches. It is particularly advantageous to provide an automatic ranging unit which, upon application of a measured value to the measuring instrument, automatically switches to a basic scale and if there are a plurality of basic scales, optionally seeks the particular basic scale with the highest sensitivity on which the measured value can be shown as a total value. In response to a search signal, the automatic ranging unit can then be switched over to a differential value scale and again if there are a plurality of differential value scales it can optionally seek the scale having the highest resolution in which the differential value can still be represented.

It is also advantageous for the automatic rounding means to be coupled to the measurement ranges for the differential value scales in such a way that more places of the digital display value are rounded off, as the sensitivity of the analog measurement range becomes lower.

A switchover from the basic scale to the differential value scale is performed only whenever this is advantageous as a consequence of particular given conditions. The search signal should therefore be triggerable manually by some operating element. The search signal can also be generated by an automatic ranging unit, which switches over to a differential value scale whenever the dynamics of the measured value drop below some threshold value.

In order to trigger the search signal by hand, it is suitable to incorporate a signal transducer into one of the measuring styli. Upon its actuation, a signal that can be picked up from the automatic measurement ranging unit is superimposed on the measured value. Alternatively, however, the signal transducer can be connected with the automatic measurement ranging unit through one or more further lines.

A holding switch can be provided on the measurement stylus as well, or on the measuring instrument itself, by way of which the automatic ranging unit can be varied in such a way that upon an actuation, the particular measurement range is fixed until it is once again released.

The choice as to whether a bar display or a pointer marker imitating a pointer, is desirable as the display marker for the analog display is individually variable but also depends on the particular measurement task. Accordingly, it may be suitable to provide switchover means that enable a switchover between the two types of display marker.

While a switchover between the basic scale and the differential value scale is typically made for reasons of space, so that only one of the two is visible at any particular time, it may be of considerable advantage if there is enough space to show both scales beside one another. In that case the change in measured value can be followed on both the basic scale and the differential value scale.

Measuring instruments are also used not only for measuring and observing measured values, but for calibration to a reference value. A reference value that indicates the digital display can be assigned to the measuring instrument with the aid of a reference value circuit. The particular difference in the measured value resulting from the calibration and the reference value is then shown as a differential value on the analog display, preferably an anlog display having a standardized scale.

Often electrical components such as resistors must be monitored for whether they are within a predetermined tolerance range. Tests of this kind are facilitated considerably by providing that a threshold value range is formed on one or both sides of a reference value related to zero. The measurement range of the standardized scales can optionally be adjusted in such a way that the beginning and end of the threshold value range are defined by the beginning and the end value of the standardized scale. In that case, setting of separate threshold markers can be avoided. Input keys are also provided for setting the reference value and the threshold values and if a signal drops below or exceeds the reference value or the threshold values, this is indicated by optionally different acoustical and/or optical signals.

By representing differential values on one scale, it is possible to considerably increase the resolution of the scale and hence the display sensitivity with the same scale length. Another way of improving the resolution of the scale is by making it longer. However, narrow limits are set for the dimensioning of the measuring instrument. The measuring instrument described in German Published, Non-Prosecuted Application No. DE-OS 34 12 297 provides a scale in which lengthening is attained by means of a U shape. A scale that is made up of at least two partial scales of equal length is substantially more suitable. The partial scales in this case are disposed parallel alongside one another and together they encompass the same measurement range. The display marker then moves from one partial scale to the other. Two partial scales, in which the zero point is located at a common end, is quite advantageous especially for showing scales with a zero at the center, because then the transition from the positive to the negative scale range can be observed quite well. Two partial scales are very convenient, especially for comparing the positive and negative amplitude of a relatively slow alternating-voltage signal in the direct-voltage range. In that case, however, reverser markers or a persistent-illumination effect must then be used.

In order to reduce the amount of space required, it is advantageous to combine two partial scales at a time. In principle, there are two possible ways of performing this combination. Either the pointer marker is disposed between the scales, or the pointer markers encompass the scales. In both cases, the pointer markers must be constructed in such a way that it is apparent to which of the two scales they are intended to refer. In the case of pointer markers located between the scales, it is sufficient if the markers change their shape upon a transition from one scale to the next, for instance by shifting an arrowhead from one end to the other.

It is of substantial significance to keep the control expenditure for the pointer markers low, so that the number of triggerable individual segments need not be increased substantially as compared with a single scale when there are a plurality of partial scales. To this end, all the display markers located one behind the other and assigned to the various partial scales for partial ranges are carried in common to a control bus. A backplate electrode is associated with each of the partial range scales and with its help the pointer markers that are not to be made visible are blanked out.

Even scales having different scale graduation marks and different designations can be matched to one another to reduce the expenditure for triggering. For instance, with all of the scales being mutually parallel, approximately the same number of scale graduation marks can be provided, on the assumption that the pointer markers come to coincide with the graduation marks on the scales. In that case the pointer markers are no longer located in a straight line one after the other and their number can also fluctuate from one scale to another. The screen segments representing the pointer markers must thus be joined with a diagonal line in the interspaces. Any positions not required for individual scales are left out or blanked out. Triggering with backplate electrodes permits only the pointer markers of one scale to be visible at a time. Upon switchover from a total scale to a standardized scale, the designation of one of the two partial range scales is suitably switched over in such a way that at the end of the two partial range scales at which zero is located when there is a zero center point, the one partial range scale indicates the end value of the scale.

Other features which are considered as characteristic for the invention are set forth in the appended claims.

Although the invention is illustrated and described herein as embodied in a digital measuring instrument for displaying a measured value that varies over time, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 1:
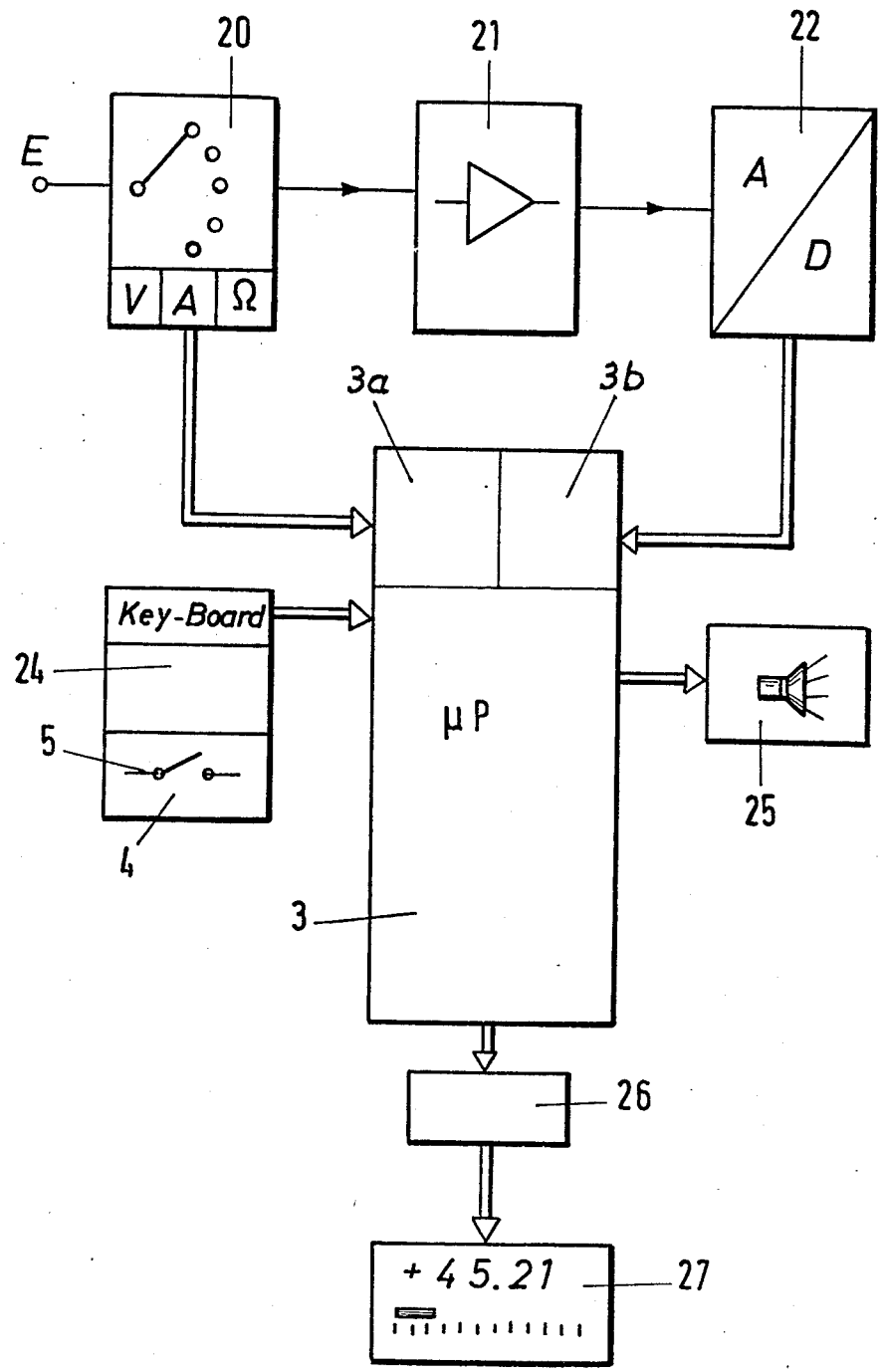
FIG. 1 is a block circuit diagram of a measuring instrument, showing the major building blocks thereof.

Referring now to the figures of the drawings in detail and first, particularly, to FIG. 1 thereof, there is seen a measured value E delivered to a measured value input unit 20, optionally amplified in an adaptation circuit 21 and sent through an analog/digital converter 22 to a microprocessor 3. The microprocessor 3 controls the entire sequence of the measurement. Accordingly, it is supplied not only with the measurement signal but with further information as well. The type of measurement variable is supplied to the computer by the measurement value input unit 20 and a keyboard 24 supplies the computer with all of the data specified by the operating elements of the measuring instrument. The operating functions encompassed by the keyboard depend on the way in which the particular measuring instrument is equipped and will be explained by referring to FIGS. 2 and 3. Of substantial significance for the invention are means 4 containing at least one switch element 5 for emitting a control signal after a predetermined holding time H has elapsed, in response to which digital displays 1a, 1b switch over to the current digital display value at that time. The microprocessor 3 essentially has two outputs. A first output 44 leads to an acoustic signal transducer 25, which in particular is capable of signalling threshold values and the fact that a measurement range has been exceeded. A second output 46 leads to a display driver 26, which in turn controls various screen segments of a display 27.

Figure 2:
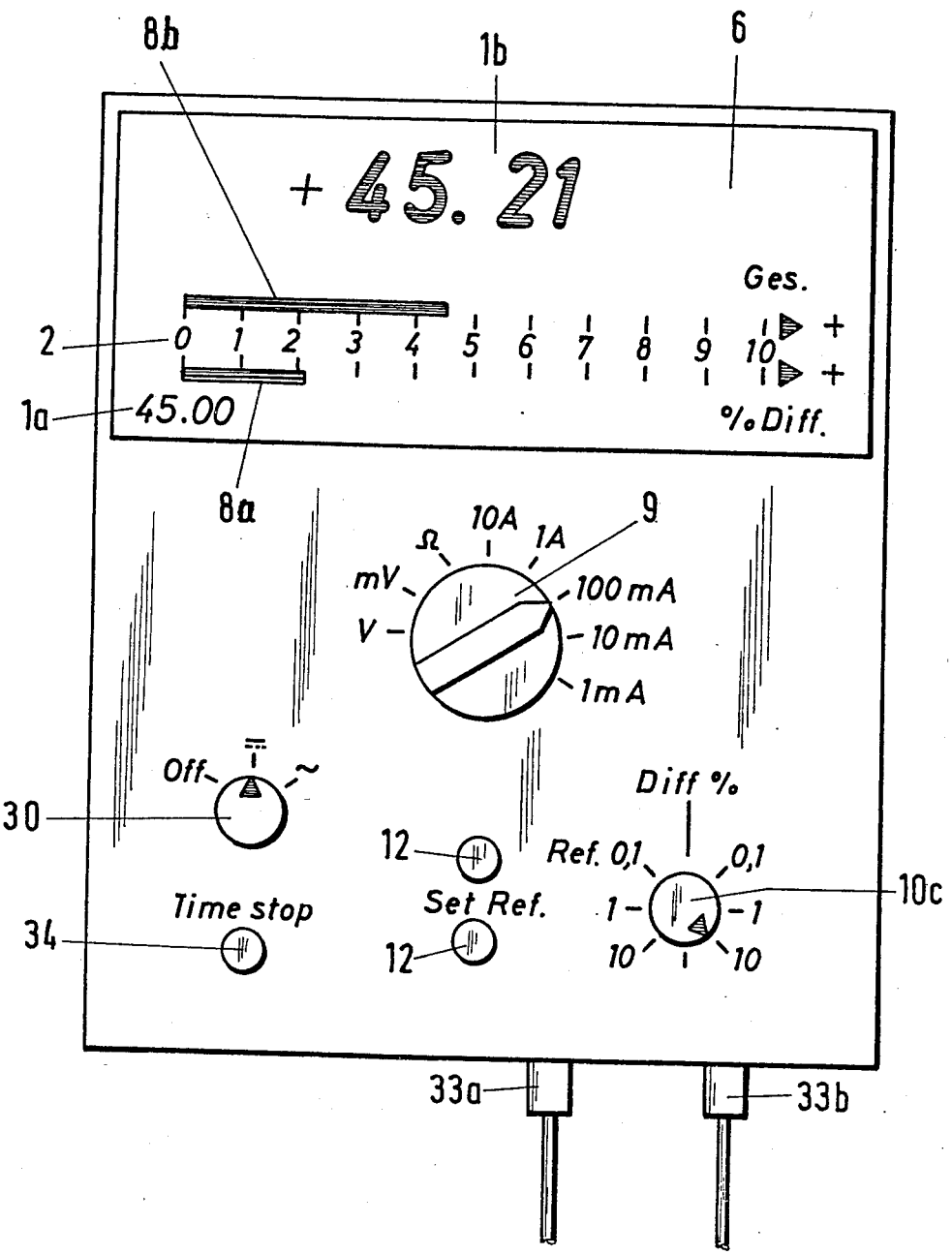
FIG. 2 is a diagrammatic, front-elevational view of a simple version of a multimeter, showing the front panel and display of the meter.

FIG. 2 shows a multiple measuring instrument, which has a display 6 made up of liquid crystals for the measured value display and a plurality of switches and keys for adjusting the various parameters that influence the display. On the display, the particular measured value is represented with the first and second digital displays 1a and 1b and an analog display 2. The analog display 2 is represented by a double scale with a graduation in tens, which are encompassed on both sides by display markers 8a, 8b. The display markers 8a and 8b are shown in this instance as bar displays, but they can also be in the form of pointer markers. The upper pointer marker 8a belongs to a scale representing the total measurement range, while the lower pointer marker 8b only displays a differential value. The differential value is calculated by the microprocessor from the difference between the instantaneous measured or cycle value and a digital display value shown on the first digital display 1a.

In the embodiment illustrated in FIG. 2, the measured value at a particular time is displayed on the second digital display 1b without any delay caused by the holding time. At this instant, the measured value is, for example, 45.21. It is not absolutely necessary to display this value, because this value can be ascertained from the first digital display 1a and the instantaneous value displayed on the differential value scale 8b. The measured value is thus displayed in three different ways: first in the second digital display 1b, then on the total analog scale having the display marker 8a, and finally on the differential value scale in the form of a differential value displayed by the display marker 8b and intended to be added to the display value of the digital display 1a. The digital display value emitted by the digital display 1a is rounded off automatically, for the sake of better addition of the differential value.

The differential value is displayed in per cent and in a typical measurement is related to the end value of the measurement range. The analog displayed differential value can thus be added to the digital display value like an absolute value. The sensitivity of the differential scale can be adjusted with a differential range switch 10c. On one hand, the differential range switch 10c permits adjustment of a percentage value related to the end value of the measurement range and on the other hand it permits adjustment of a percentage value related to a reference value. The reference value can be supplied to the digital display 1a with the aid of input keys 12, instead of the measured value.

The length of time during which a digital display value is emitted for measured value ascertainment on the digital display 1a depends on a holding time, which in the present example is set at a fixed value. It may amount to 3 or 5 seconds, for example. In the event that the second digital display 1b is not provided, the holding time can be terminated as desired by means of a push key 34, so that at that instant the instantaneous measured value appears in the digital display 1a. If there is no second digital display, however, rounding off of the first digital display must be dispensed with, unless the automatic rounding means is capable of being switched off. At each change of the digital display 1a, the analog differential value display begins in the vicinity of zero, in accordance with the rounding selected. At negative values, the sign (±) of the scale changes. The display marker 8a on the total scale remains unchanged by the switchover of the digital display 1a. The measuring instrument also has a switch 30 for different types of current and plug connections 33a, 33b for measurement lines.

Figure 3:
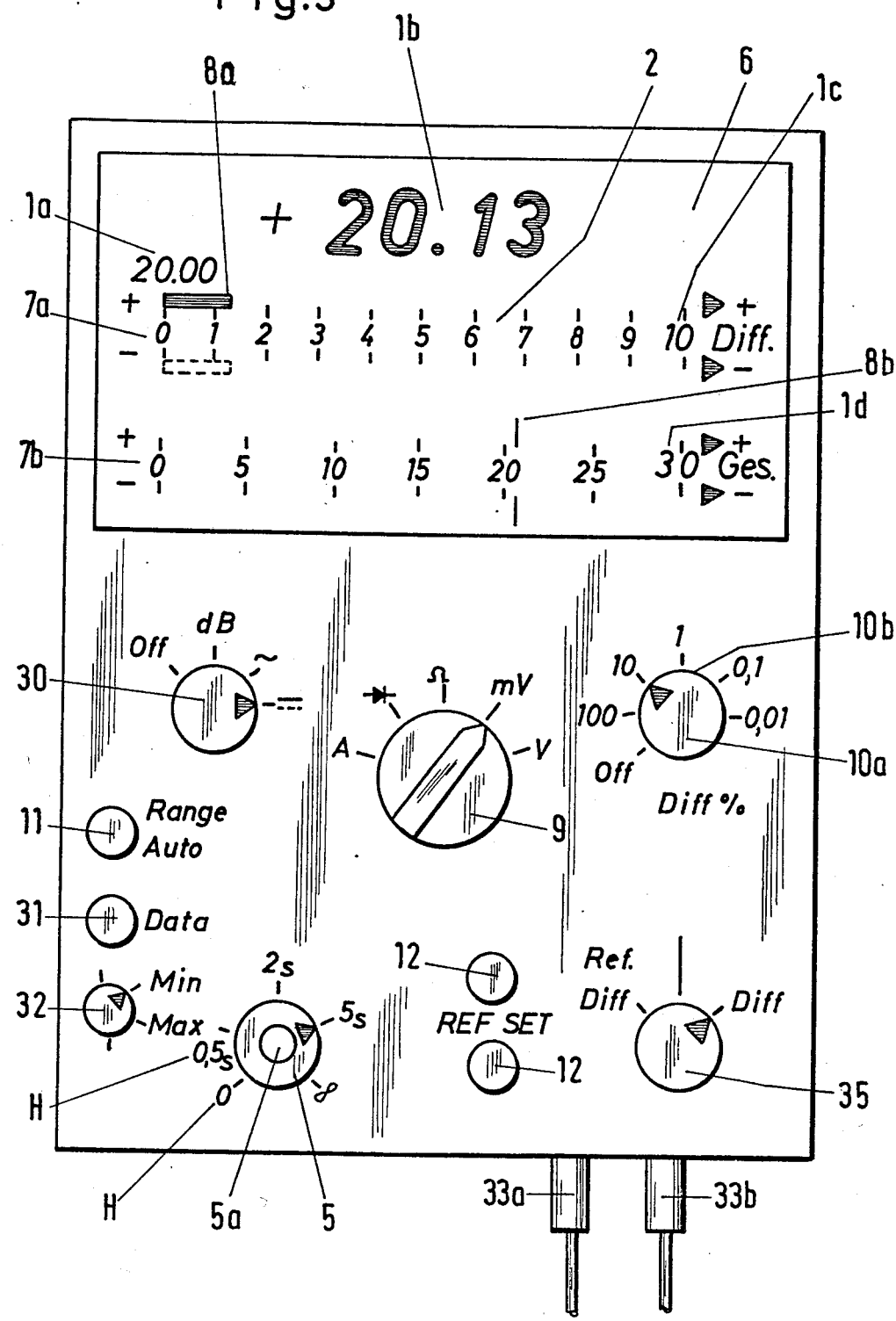
FIG. 3 is a view of a multimeter similar to FIG. 2 in a more sophisticated version, showing the front panel and display of the meter.

FIG. 3 shows a more convenient measuring instrument than that of FIG. 2. The FIG. 3 instrument has two plus/minus scales, one of which has a graduation by tens and the other of which has a graduation by threes. Each scale 7a, 7b is formed of two partial scales disposed parallel to one another, each of which begins at zero. One of which the partial scales encompasses all the positive scale values and the other all the negative scale values. In other words, these are scales having a zero point center, but the zero point is located all the way to the left. However, since the display markers 8a, 8b in the case of the scales 7a, 7b can move from one partial scale to the other, which is represented in the drawing by a dashed line, a plus/minus change is also easy to observe in the zero point range.

The scale 7a is again constructed in the form of a standardized per cent scale for displaying the differential value and the scale 7b is constructed in the form of a total scale. A total of four controllable displays 1a, 1b, 1c, 1d are assigned to the measuring instrument. The digital display 1a again characterizes a digital display value to be added to the differential value; the digital display 1b characterizes the instantaneous measured value; the digital display 1c characterizes the end value of the measurement range of the differential value scale; and the digital display 1d characterizes the end value of the measurement range of the total scale. The display marker 8a is in the form of a pointer marker, and the display 8b is in the form of a bar display.

A switch 35 is provided for switching over between a reference range for calibration and monitoring operations and a position for typical measurement ranges. In the reference range, the differential value is related percentagewise to the particular reference value and in the measurement ranges is it related to the particular end value of the measurement range. A switch 9 adjusts the sensitivity of the total measurement range, or in the case of an automatic measurement range selection, it only adjusts the particular measurement variable, and the sensitivity of the differential range is adjusted with the switch 10. If one of the two scales 7a, 7b is made visible for reasons of space, a switch 10b can be provided with scale switchover means 10a in the form of a push switch, which must be actuated to effect a changeover from the basic scale 7b to the differential scale 7a.

In order to adjust the reference value, two input keys 12 are provided, and the holding time H can be selected for holding times from zero to infinity be means of a switch 5. The switch 5 which is equipped with a key 5a, permits an abrupt interruption of the holding time and thus the emission of the particular cycle value on the digital display 1a.

Regarding other functions, the measuring instrument of FIG. 3 also includes a current type switch 30, a key 11 with which the particular automatically selected measurement range can be fixed, a key 31 for fixing the particular instantaneous value in the digital display 1b, and a switch 32 with the aid of which a minimal or maximal value of the measurement signal observed over a predetermined period of time can be fixed in the digital display 1b.

Figure 4:
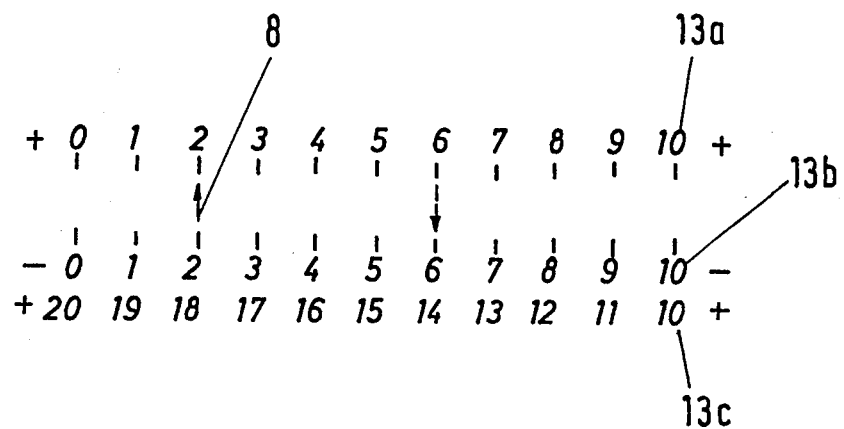
FIG. 4 is an indication of two partial scales with pointer markers located therebetween.

FIG. 4 shows a scale layout having two partial scales 13a and 13b which include the associated display markers 8. Each display marker 8 changes its shape, for instance the direction toward which the arrowhead thereof points, as soon it changes from one partial scale to the other. While the partial scales 13a, 13b again together form a plus/minus scale, the partial scale 13a along with the partial scale 13c provides a plus scale that extends from zero to twice the end value.

Figure 5:
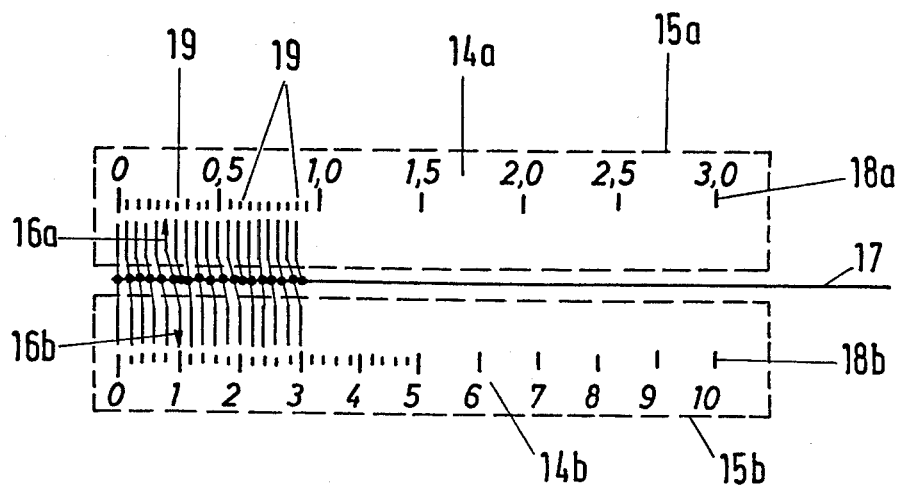
FIG. 5 is a front-elevational view of control lines for pointer markers of two scales disposed in parallel with a different scale graduation.

FIG. 5 shows means for keeping the control expenditure low when there are two scales 14a and 14b located parallel to one another having different scale graduations. A scale 14a has 60 scale graduation marks 18a, not counting the zero position, while a scale 14b has only 50 scale graduation marks. One triggerable screen segment for representing one display marker is to be assigned to each of the scale graduation marks. The screen segments located approximately opposite one another are connected with one another in pairs and applied to a control bus 17, by which two display markers connected to one another are triggered at a time. Since more screen segments for the display markers 16 are assigned to the scale 14a then the scale 14b has, individual display markers 16 at specific positions 19 of the scale 18a are connected only with the control bus 17, but not with screen segments of the scale 18b. With the aid of backplate electrodes 15a and, 15b, one or the other scale can be selectively switched to be invisible, either in its entirety, or only the display marker associated therewith.

Figure 6:
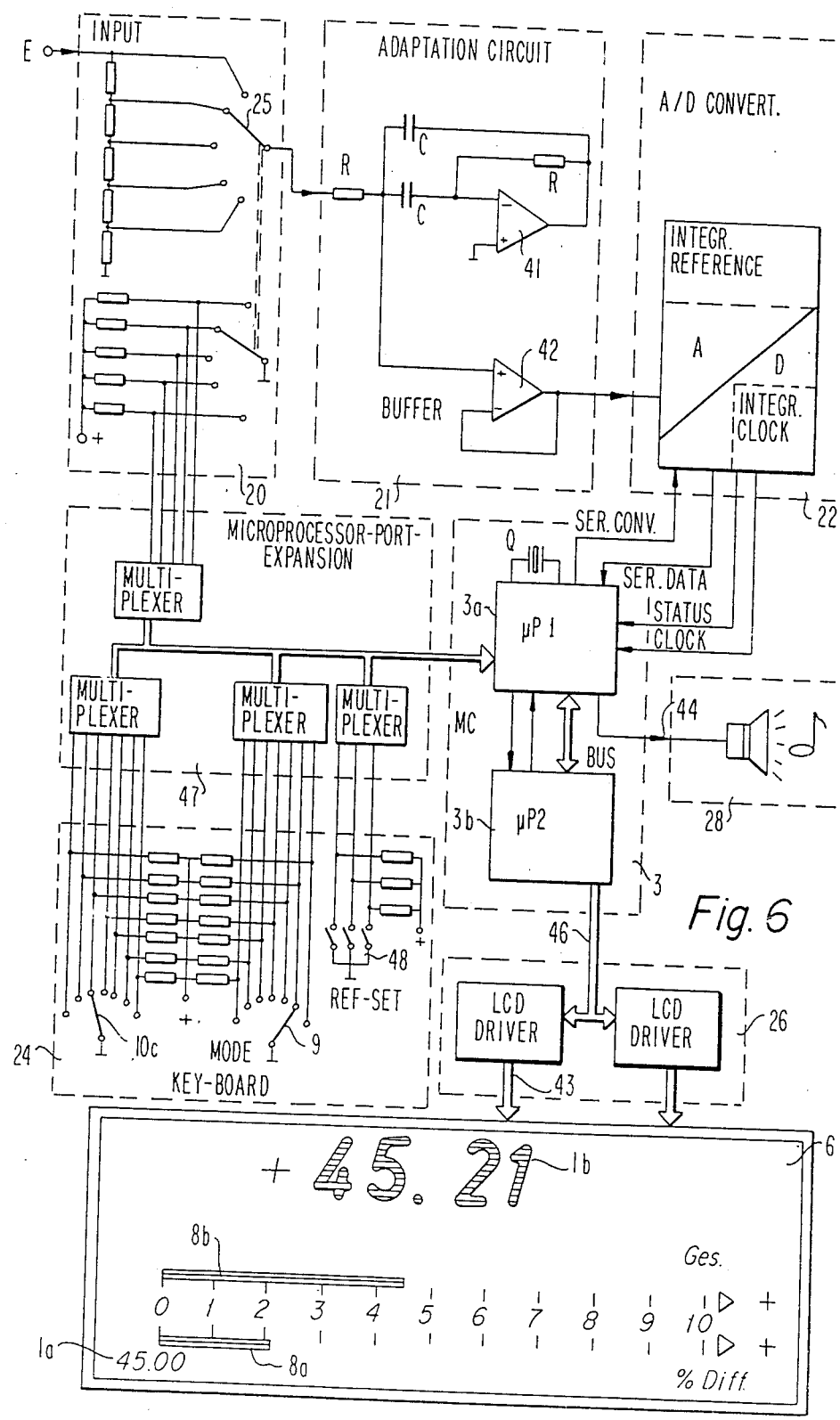
FIG. 6 is a block diagram of the invention showing the major building blocks thereof, the mutual interconnections thereof and a front-elevational view of the display.

An especially advantageous embodiment of the structure shown in FIG. 1 is seen in FIG. 6 since the individual building blocks are well known and conventional, only the basic function thereof is indicated. Unnecessary details, not needed for the understanding of the invention, are not shown. Therefore, FIGS. 1 and 6 do not correspond exactly in regard to the number of switch positions of the measuring range switch 25. The inclusion of all of the modes of operation covered in the description hereinabove would not be possible and are not necessary for illustrating the invention.

The measurement value input unit 20 includes a measurement range switch 25 that matches the input signal E to the active filter 21 connected thereto by means of voltage dividers. The filter 21 is a low-pass filter of the second order and serves to emulate the dynamic characteristics of a moving-coil meter. The filter 21 has an upper cut-off frequency of approximately 2 Hz. A first operational buffer amplifier 41 which is part of the low-pass filter may, for example, be of the type TL 081 of the firm Texas Instruments, which has good dynamic characteristics and only offers low loading of the voltage dividers. A second operational amplifier 42, coupled as a buffer amplifier, which may be a TI type LT 1012, does not have to have any particular dynamic characteristics, but provides low bias or off-set distortion. The connection of the first operational amplifier 41 with RC-circuits provides suppression of ac-voltages, so that only dc-voltage is present at the output of the active filter. In case an ac-signal is to be measured, the active filter must be switched to another configuration, so that the input signal E is connected to an effective value converter, which generates a dc-voltage that is proportional with the effective value of the ac-voltage to the filter 21.

Following the filter 21, the measuring signal is connected to a 16-bit analog-to-digital converter (A/D converter) 22 (e.g. a type ADC 7 1 from the firm Analog Devices), which performs at least 20 measurements per second. The reference voltage source is already included in this A/D converter, as well as a clock generator that provides clock and status signals, corresponding to conversion rates, to the microcomputer 3 connected thereto.

In the present case, the microcomputer 3 includes a port expansion 47, a first microprocessor 3a and a second microprocessor 3b. In response to an associated control program stored in a non-illustrated memory, the microcomputer 3 controls the complete measuring operation of the measuring device. On one side, the first microprocessor 3a communicates with the A/D converter 22 and on the other side, it communicates through the port expansion 47 with the measurement input unit 20 and the keyboard control unit 24. In case valid measurements are available from the A/D converter 22, a command is generated from the quartz timing-controlled first microprocessor 3a, through a start-convert lead for serially reading the data of the values of the measurements.

Furthermore, a composite switch-word is transmitted through the port expansion 47 to the first microprocessor 3a. The composite switch-word includes six bytes, including in turn the position of the measurement range switch 25 of the measurement input unit 20, the range switch 10c, the mode switch 9 and the reference-set switch 48. Two bytes which include the measured value data and two bytes which include control data are transmitted from the composite switch word to the second microprocessor 3b, as soon as the data are available. The port expansion 47 makes it possible to concentrate the multiplicity of switch positions represented by the switch word to a few inputs of the first microprocessor 3a, by means of multiplexing.

The operation of the switches in the keyboard unit 24 already described in detail hereinabove, and accordingly, the range switch 10c controls the scale expansion. The mode switch 9 controls the enabling of the automatic scale selection, which provides delay times of 1, 2 or 5 seconds for scale-switching and enables the Ref-Set switch 48 to enter reference values by means of reference-value-enter keys on the display 27, shown in FIG. 1. A loadspeaker or sounder 28, which emits an acoustic signal e.g. as soon as the lower or upper reference values are reached or passed, is also connected to the first microprocessor 3b. In case of changes in the signal frequency, it can also operate to indicate the approaching or separation from a reference value.

Both microprocessors 3a and 3b may be of the type 80 C 49 from NEC. The major part of displaying the measurement values on the display 6 is performed by the second microprocessor 3b. On one side, the second microprocessor 3b is connected with the first microprocessor 3a through a data bus and control leads and in accordance with its control program, it provides instructions to an LCD-display driver 26, e.g. of the type HC 61602 from Hitachi, which, in turn, control the segments of the LCD-display 1.

Figure 7:
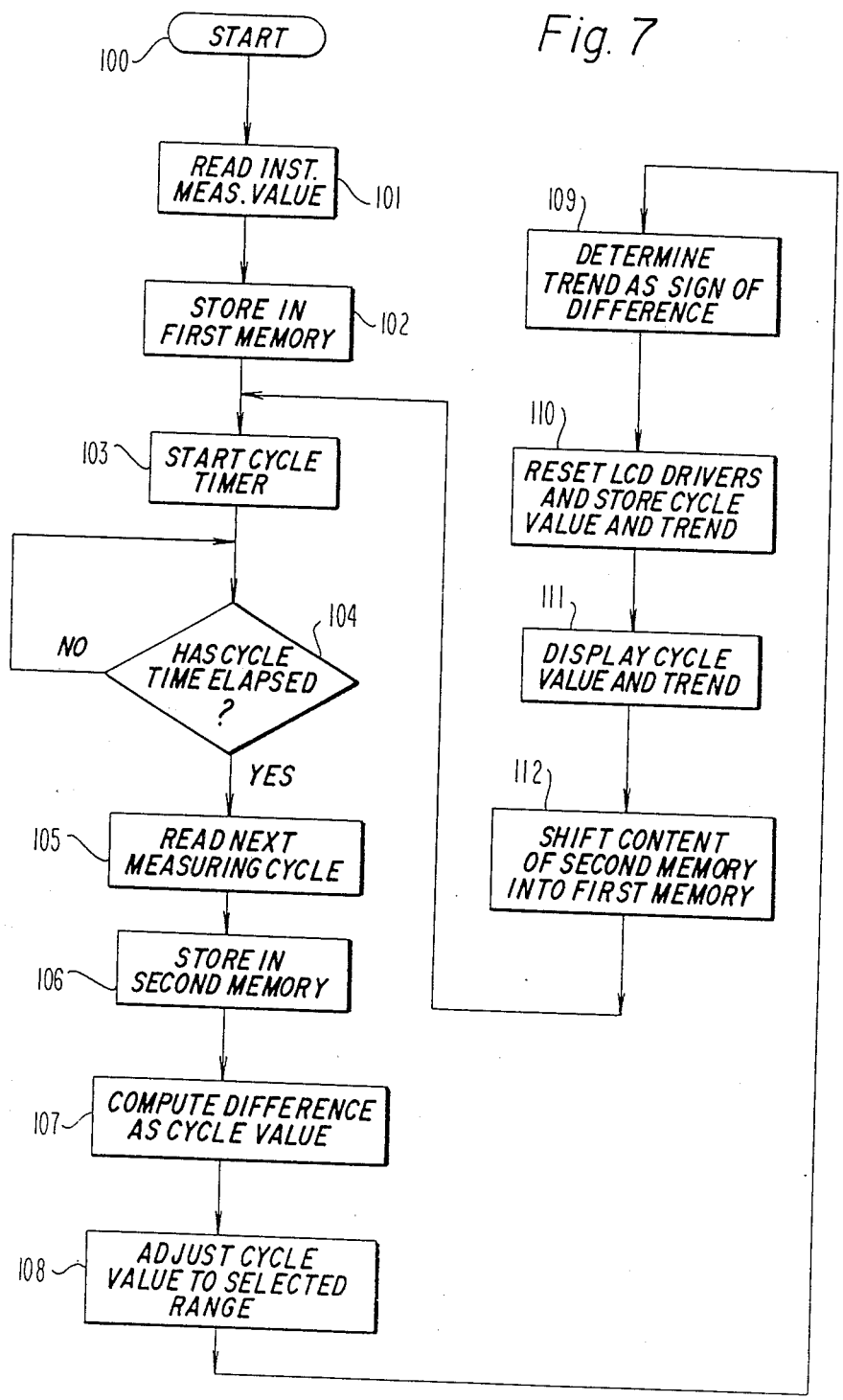
FIG. 7 is a flow chart showing the step-by-step operation of the invention.

The program for the second microprocessor 3b is a chain of logic steps for enacting the inventive concept. The writer of the program decides the sequence of the individual logic steps. As an example, a program is shown in FIG. 7 in flow-chart form. The program shows steps 100–112, wherein the numerals 1 to 12 show the program divided into larger steps. These steps are, briefly stated:

100. Start.
101. Read instantaneous measurement value.
102. Store in first memory
103. Start cycle timer
104. Has cycle time elapsed 105. Read next measuring cycle
106. Store in second memory
107. Compute in second memory
108. Adjust cycle value to selected range
109. Determine trend as sign of difference
110. Reset LCD drivers and store cycle value and trend
111. Display cycle value and trend
112. Shift content of second memory into first memory

I claim:

1. Digital measuring instrument for displaying a measured value (E) varying over time, comprising sequence control means (3) for ascertaining at least one instantaneous value in each of a plurality of measuring cycles by sensing a measured value (E) and for forming a cycle value from the instantaneous values occurring per measuring cycle, said sequence control means (3) including a memory (3b) storing the most recent cycle value until a new cycle value is present that replaces an old cycle, a digital display (1a) connected to said sequence control means for displaying a digital display value derived from the most recent cycle value in response to a control signal, said sequence control means (3) retaining the digital display value until it forms a current digital display value from a new cycle value in response to a new control signal, said sequence control means (3) forming differential values between a given digital display value and the continuously occurring cycle values, an analog differential value scale (7a) connected to said sequence control means for displaying various differential values, and means (4) connected to said sequence control means containing at least one switching element (5) emitting a control signal after the expiration of a predetermined holding time for switching said digital display (1a) to the instantaneous current display value.

2. Measuring instrument according to claim 1, wherein the duration of the holding time is variable as a function of dynamics of the measured value.

3. Measuring instrument according to claim 1, including a display device (6), at least one other scale (7b) disposed on said display device with said first-mentioned scale, said digital display (1a) being disposed on said display device, and display markers (8) associated with said scales (7) and disposed on said display device (6), said scales having triggerable screen segments for a quasi-analog display, said other scale being a basic scale (7b) displaying the measured value encompassing an entire given measurement range represented on said differential value scale (7b) as the sun of a differential value.

4. Measuring instrument according to claim 3, including scale switchover means (10a) for switching over said measured value display between said differential value scale (7a) and said basic scale (7b).

5. Measuring instrument according to claim 4, wherein said scale switchover means (10a) includes means for making at least one of said scales (7) selectively invisible.

6. Measuring instrument according to claim 3, wherein said differential value scale (7a) is a standardized plus/minus scale.

7. Measuring instrument according to claim 4, including at least one other base scale (7b) and at least one other differential value scale (7a), said sequence control means (3) including an automatic ranging unit (3a) automatically switching to said basic scale (7b) upon application of a measured value to the measuring instrument and seeking one of said base scales (7b) having the highest sensitivity on which the measured value can be presented as a total value, and said automatic ranging unit (3a) switching over to said differential value scale (7a) in response to a search signal and seeking one of said differential value scales having the highest resolution in which the differential value is still capable of being represented.

8. Measuring instrument according to claim 7, wherein said search signal is triggered by said automatic ranging unit (3a), and said automatic ranging unit switches over to one of said differential value scales (7a) whenever the measured value dynamics drop below a threshold value.

9. Measuring instrument according to claim 7, including a signal transducer incorporated into a measuring stylus, being actuatable manually during the measurement and emitting a signal to said automatic ranging unit (3a) for triggering said search signal.

10. Measuring instrument according to claim 7, including automatic rounding means coupled with differential value measurement ranges (10) of said scales (7a) for rounding off more places of the digital display value of said digital display (1a) to zero as the sensitivity of said analog display (2) for displaying the differential value becomes lower.

11. Measuring instrument according to claim 1, including a control switch (32) switching over said digital display (1a) for displaying the instantaneous measured value.

12. Measuring instrument according to claim 11, wherein said control switch has further switching positions for the display of a maximal value and a minimal value occurring during a monitoring period.

13. Measuring instrument according to claim 1, wherein said differential value scale (7a) is standardized for displaying a beginning and an end value, and including a reference value switch (12) for supplying a reference value to said digital display (1a), means for representing a difference between a measured value (E) and the reference value as a difference value on said standardized differential value scale (7a), and a threshold value range formed on at least one side of the reference value relative to zero, said threshold value range having a beginning and an end defined by said beginning and said end value of said standardized differential value scale (7a).

14. Measuring instrument according to claim 1, including a display having triggerable screen segments providing a quasi-analog display, at least two scales (13a, 13b) parallel and alongside one another, each of said scales encompassing one partial range scale, and said partial range scales (13) together encompassing a total given measurement range, and a display marker (8) traveling from one of said partial range scales (13a) to the next one of said partial range scales (13b).

15. Measuring instrument according to claim 14, wherein said scales have the same length.

16. Measuring instrument according to claim 14, wherein said at least two scales are in the form of two partial range scales (13a, 13b) forming a measurement range with a zero point center, said zero point being located at a left-hand end of said two partial range scales, one of said partial range scales (13a) having increasingly positive values and the other of said partial range scales (13b) having increasingly negative values toward the other common end.

17. Measuring instrument according to claim 14, including a display marker (8) disposed between said two partial range scales (13a, 13b), said display marker only changing the shape thereof upon transition from one of said partial range scales (13a) to the other (13b).

18. Measuring instrument according to claim 17, including another display marker, said display markers (16a, 16b) being disposed one behind the other and each being associated with a respective one of said partial range scales (14a, 14b), a control bus (17) connected to said partial range scales for triggering said partial range scales in common, and a backplate electrode (15a, 15b) for each of said partial range scales (14a, 14b) for blanking out pointer markers (16) that are supposed to become invisible.

19. Measuring instrument according to claim 18, wherein said partial range scales (14a, 14b) have different scale graduations and different designations and are matched to one another with substantially the same number of scale graduation marks (18a, 18b), said pointer markers (16) have positions coinciding with scale graduation marks (18), and each two pointer markers (16a, 16b) being offset from one another, located on one line, associated with different scales (14a, 14b), joined to one another and triggered in common, one of said scales (14a) having more positions for said pointer marker (16a) than the other and having individual positions (19) connected only to said control bus (17) but not to a position of the other of said scales (14b), said pointer markers (16) being triggered in connection with said backplate electrodes (15a, 15b) for making only said pointer marker of one of said scales visible at a time.

20. Measuring instrument according to claim 16, including means for switching over a designation of one of said partial range scales causing one of said partial range scales to display an end value of said scale at an end of said two partial range scales at which zero is located with a zero point center.

* * * * *